United States Patent [19]
Scholz

[11] Patent Number: 5,329,423
[45] Date of Patent: Jul. 12, 1994

[54] COMPRESSIVE BUMP-AND-SOCKET INTERCONNECTION SCHEME FOR INTEGRATED CIRCUITS

[76] Inventor: Kenneth D. Scholz, 4150 Willmar Dr., Palo Alto, Calif. 94306

[21] Appl. No.: 46,334

[22] Filed: Apr. 13, 1993

[51] Int. Cl.$^5$ .............................................. H05K 7/02
[52] U.S. Cl. .................................. 361/760; 361/762; 361/767; 361/792; 361/808; 257/692; 257/738; 439/66; 174/52.4; 174/263
[58] Field of Search ............... 361/760, 761, 762, 764, 361/767, 771, 792, 795, 807, 808; 439/66, 91; 174/52.4, 257, 262–264, 266; 257/692, 738, 773, 778, 780, 797

[56] References Cited

U.S. PATENT DOCUMENTS

| | | | |
|---|---|---|---|
| 4,545,610 | 10/1985 | Lakritz et al. | 29/589 |
| 4,617,730 | 10/1986 | Geldermans et al. | 29/843 |
| 4,940,181 | 7/1990 | Juskey, Jr. et al. | 228/180.2 |
| 5,065,280 | 11/1991 | Karnezos et al. | 361/386 |
| 5,142,444 | 8/1992 | Matta et al. | 361/386 |

FOREIGN PATENT DOCUMENTS

| | | |
|---|---|---|
| 3305952 | 8/1984 | Denmark . |
| 439134 | 7/1991 | European Pat. Off. . |
| 1142750 | 6/1986 | Japan . |

*Primary Examiner*—Leo P. Picard
*Assistant Examiner*—Young Whang

[57] ABSTRACT

A electrically interconnected assembly includes an electronic component, such as an integrated circuit chip, having a first pattern of contact sites and includes a substrate having a second pattern of contact sites corresponding to the first pattern. The electronic component is demountably connected to the substrate by a bump-and-socket arrangement at each pair of contact sites. One of the contact sites has a raised bump that is received within a depressed area of the other contact site. The raised bumps are pressed into the depressed areas, forming a ring of contact to electrically and mechanically connect the electronic component to the substrate. Preferably, the depressed areas are formed in a compliant material that allows some deformation but not so much as to allow the raised bumps to bottom out against the depressed areas. The assembly may be used in forming multi-chip modules having demountable integrated circuit chips.

17 Claims, 6 Drawing Sheets

COMPRESSIVE BUMP-AND-SOCKET INTERCONNECTION SCHEME FOR INTEGRATED CIRCUITS

TECHNICAL FIELD

The present invention relates generally to electrically and mechanically connecting two members and more particularly to interconnection schemes for joining an integrated circuit chip to a substrate.

BACKGROUND ART

Multi-chip modules which include a number of integrated circuit chips in a single package play an increasingly important role in the electronics industry. The chips within a module may be functionally equivalent, such as an array of memory chips to provide a capability of forty megabytes. Alternatively, the chips may be functionally related, such as a chip set comprising a read only memory chip, a random access memory chip, a microprocessor and an interface chip.

An important concern in the fabrication of a multi-chip module is the method of electrically connecting the integrated circuit chips to the module. This concern is equally important in connecting chips to other substrates as well. Three well known techniques are commonly referred to as wire bonding, tape automated bonding and surface mounting. The wire bonding method is one in which miniature wires are connected at first ends to input/output pads of an integrated circuit chip. The opposite ends of the bond wires are welded to a substrate, such as a multi-chip module. Wire bonding can be performed with gold wire by thermal compression, ultrasonic or thermal sonic techniques, or with aluminum wire by the ultrasonic technique.

Tape automated bonding involves the formation of a spider-like metal pattern of conductive fingers which radiate outwardly from the integrated circuit chip for attachment to contact sites of a substrate.

Integrated circuit chips may also be fixed to a substrate using a surface mounting method in which solder bumps are formed at the input/output pads of the chip. The chip is placed face down onto the substrate, whereafter the temperature is increased to cause the solder bumps to reflow for direct bonding of the input/output pads of the chip to contact sites on the substrate. This method is sometimes referred to as flip-chip mounting, since the chip is faced downwardly onto the substrate.

Less conventional chip interconnection methods are also known. For example, U.S. Pat. No. 5,065,280 to Karnezos et al. describes a module in which chip interconnect frames are brought into contact with a multilayer flexible printed circuit board which connects to a motherboard.

While each of the interconnection methods has a number of desirable aspects, as the density of input/output pads of integrated circuit chips increases, precision chip alignment during mounting onto a substrate becomes more critical. The pitch of input/output pads requires a precise alignment to contact sites on a substrate such as a multi-chip module. Even with the use of tape automated bonding frames which have leads that "fanout," the pitch at the outer lead ends may be 4 mil or less.

Moreover, conventional interconnection methods in which input/output pads or leads are permanently attached to contact sites on the substrate render it difficult to repair or replace defective chips. Typically, a single defective chip in a multi-chip module will require the entire module to be discarded.

It is an object of the present invention to provide an electrical assembly in which assembly components can be repeatedly attached and detached without requiring complicated or cost-ineffective techniques.

SUMMARY OF THE INVENTION

The above object has been met by an electrical assembly in which the electrical interconnection arrangement itself aids in properly aligning first and second members of the assembly. A bump-and-socket arrangement provides a degree of self-alignment and allows the members to be demountably attached to one another. In a preferred embodiment, the assembly is a chip package in which an integrated circuit chip is in electrical communication with a substrate via an array of conductive bump-and-socket mechanisms.

Raised conductive bumps extend from either contact sites on the substrate or input/output pads of the integrated circuit chip. The raised bumps are received in depressed areas that form the sockets. For example, in the embodiment in which the raised bumps extend from input/output pads of the integrated circuit chip, the depressed areas are at contact sites of the substrate. The reverse arrangement is also possible.

The socket should be slightly smaller in dimension than the raised bumps, so that a firm wedging contact is established prior to travel of the integrated circuit chip being limited by contact of the chip surface with the substrate surface. The wedging contact provides a number of advantages. Firstly, a broad contact is established in order to reduce current density. Moreover, the integrated circuit chip is demountable, thereby combining the advantages of surface mount technology with the advantages of socketed connectors.

The surfaces of the sockets and the raised bumps slide against each other when the integrated circuit chip is attached to the substrate. As a consequence, there is a scrubbing action that aids in clearing oxides and other surface contaminants. This scrubbing action ensures a clean metal-to-metal contact.

Another advantage of the wedging contact is that the present invention provides a degree of self-alignment, as the integrated circuit chip will shift if the raised bumps are slightly misaligned with the sockets. Additionally, the present invention reduces the need of strict manufacturing tolerances with regard to surface planarity. Preferably, either the raised bumps or the sockets are compliant, thereby also reducing the tolerances with regard to accuracy of fit. In the preferred embodiment, the sockets are depressed areas in a compliant coating, such as a polyimide coating, and the sockets have a coating of conductive material so that multiple points of contact are established at each socket when a raised bump is pressed therein. The conductive material should be characterized by a satisfactory adhesion to the contact-site metal and a sufficient strength to tolerate both the deformation imparted upon receiving the raised bump and the strains imparted by forces acting at the chip/substrate interface. Sputtered chromium-gold may be employed.

Alternatively, compliant socket assemblies may take the form of depressions within a layer of conductive material such as a conductive polymer or a metal-loaded polymer.

It is also contemplated to form each socket by providing an array of bumps between which a mating bump is to be received.

BEST MODE FOR CARRYING OUT THE INVENTION

Figure 1:
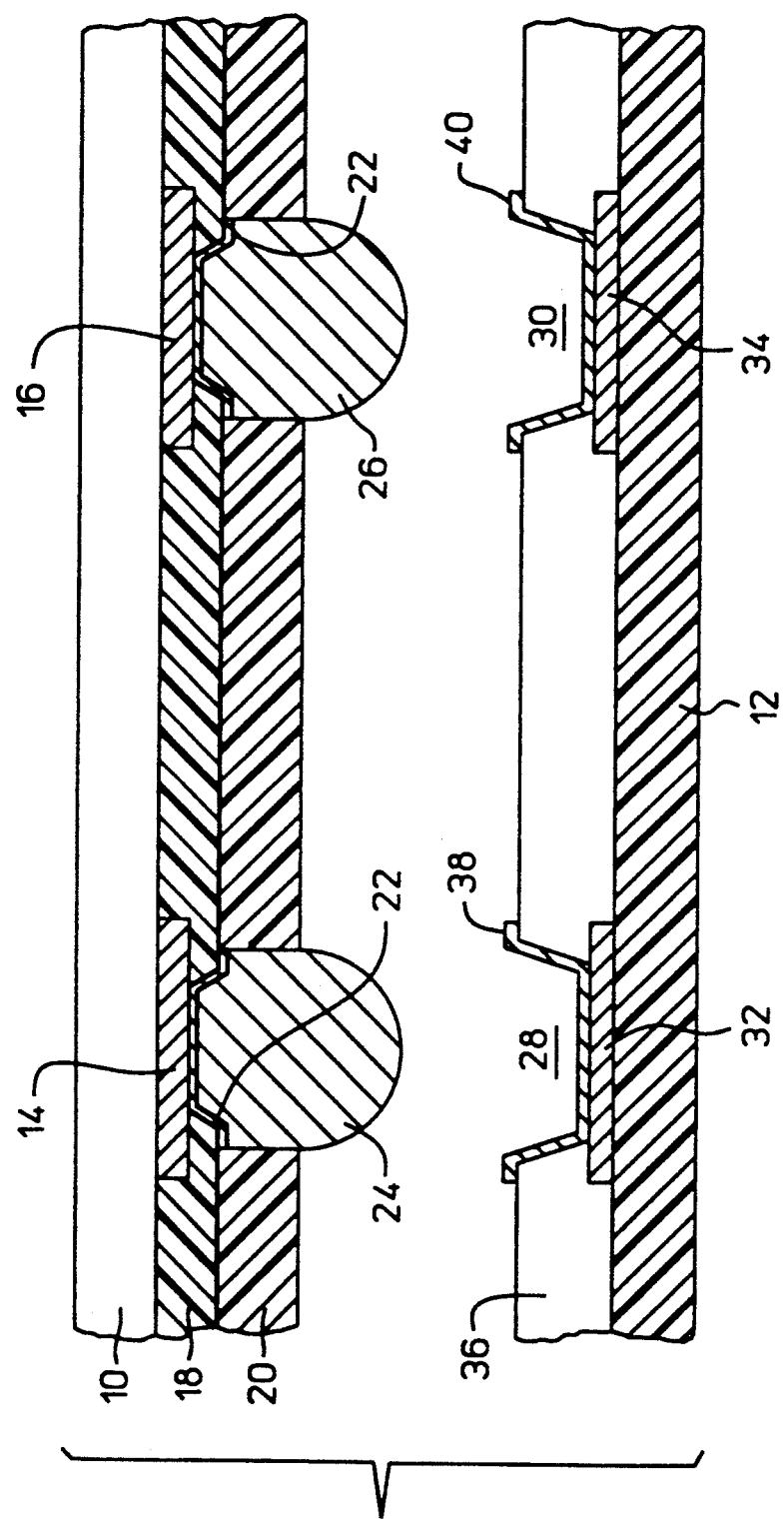
FIG. 1 is a side view of an integrated circuit chip positioned atop a substrate, wherein the chip and substrate have a bump-and-socket arrangement in accordance with a first embodiment of the present invention.

With reference to FIG. 1, an integrated circuit chip 10 is shown as being positioned above a substrate 12. The substrate may be a portion of a multi-chip module, but this is not critical. The present interconnection scheme may also be used in electrically joining components other than integrated circuit chips to substrates such as printed circuit boards.

The integrated circuit chip 10 includes input/output pads 14 and 16. The pads 14 and 16 are standard in the art. Typically, the pads are aluminum members formed during the fabrication of the integrated circuit chip 10 to allow electrical communication between chip circuitry and external circuitry.

A passivation layer 18 coats the surface of the integrated circuit chip 10. Acceptable materials for forming the passivation layer include silicon oxide, silicon nitride and PSG. An encapsulant coating 20 provides environmental protection of the integrated circuit chip. The encapsulant coating may be made of a polymer, such as polyimide. The coating is applied to the surface and is patterned using standard photolithographical techniques to expose the input/output pads 14 and 16 of the integrated circuit chip.

The encapsulant coating 20 protects the integrated circuit chip 10 from condensation which could otherwise serve as an electrolytic conductor. The coating also provides an alpha particle barrier.

While not critical, the integrated circuit chip preferably includes a base metallization layer 22 in contact with the input/output pads 14 and 16. The base metallization layer should be made of a material which adheres well to aluminum input/output pads and which has a good step coverage. Acceptable metals include chromium and titanium tungsten.

Contact bumps 24 and 26 are formed on the base metallization layer 22. The contact bumps may be formed either before or after the polymer encapsulant coating 20 is formed. The contact bumps may consist of electroplated gold, a metalized polymer, or gold filled epoxy or polyimide. Preferably, contact bumps that are not gold include a gold coating in order to minimize contact resistance. Unlike solder bumps of the prior art, contact bumps 24 and 26 will not be heated in order to cause a reflow. Rather, the dimensions of the contact bumps are determined to maximize contact with sockets 28 and 30 of the substrate 12. The contact bumps may be larger than conventional solder bumps, but this is not critical.

The sockets 28 and 30 of the substrate 12 are formed above conductive traces 32 and 34 on the substrate 12. The conductive traces are standard substrate members. A suitable material for the conductive traces is copper.

A compliant coating 36 is formed atop the substrate 12. The compliant coating has an elastic modulus selected to allow some deformation when the contact bumps 24 and 26 are pressed into the sockets 28 and 30. Polyimide is a suitable material. As will be explained more fully below, in the embodiment of FIG. 1, the sockets are depressed areas that adjust to the contact bumps. The depressed areas may be formed in the polyimide coating 36 using known chemical etching or reactive ion etching techniques. Alternatively, the depressed areas may be formed mechanically, as for example by drilling or molding the polyimide coating.

A socket metallization layer 38 and 40 is preferably formed within the depressed areas to define the sockets 28 and 30. In the same manner as the base metallization layer 22 of the integrated circuit chip 10, the socket metallization layer 38 and 40 must be chosen for its adhesive, conductive and step coverage properties. Another concern in selecting the material to form the socket metallization layer 38 and 40 is the ability to tolerate some deformation. In the embodiment of FIG. 1, deformation will be imparted by the mating of the contact bumps 24 and 26 with the base metallization layer. Deformation will also be imparted by forces acting at the chip/substrate interface during subsequent packaging steps. A material having the desired properties is a chrome-gold alloy that can be sputtered onto the substrate 12.

Figure 2:
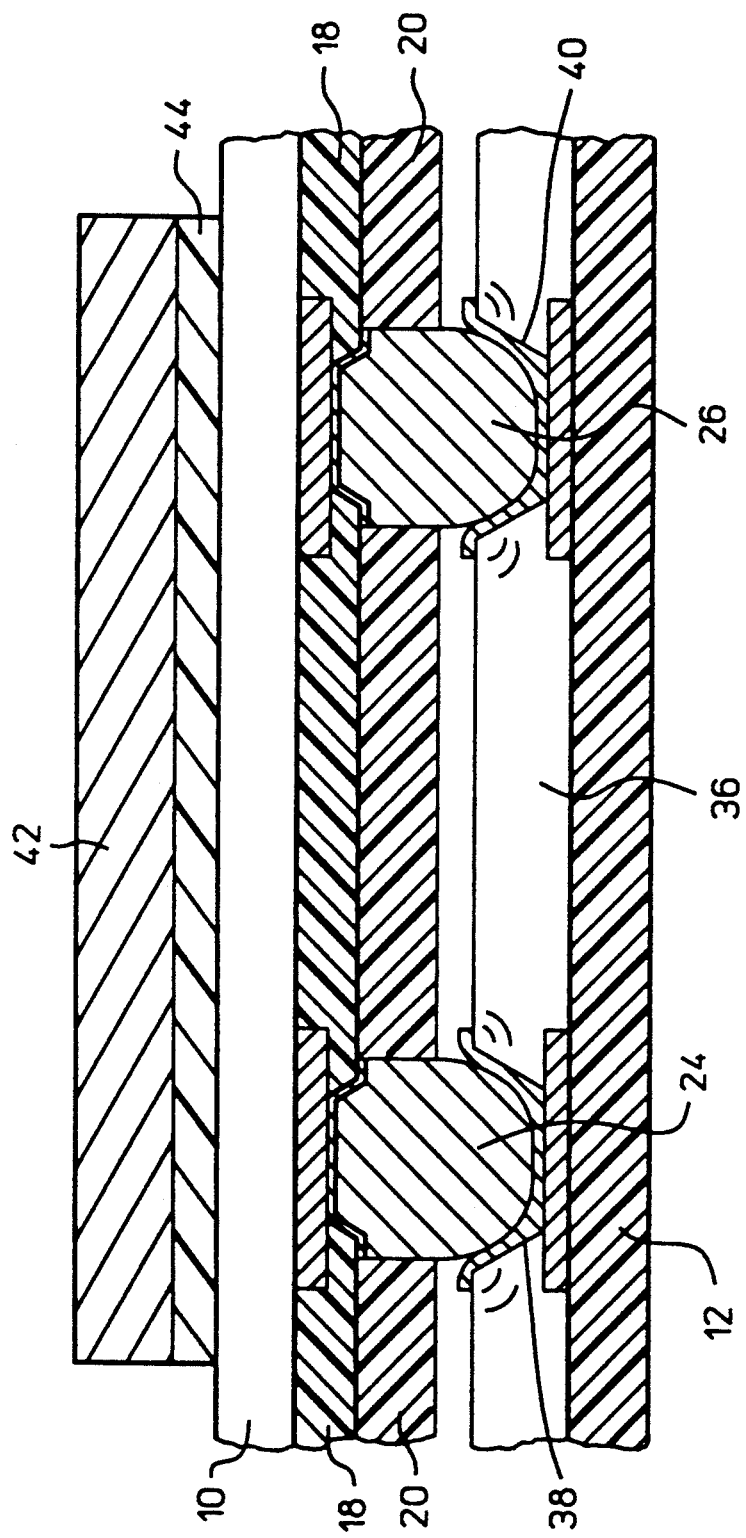
FIG. 2 is a side view of the chip and substrate of FIG. 1 following compression of the bump of the chip into the socket of the substrate.

Referring now to FIG. 2, the contact bumps 24 and 26 are shown as being press fit into the socket metallization layer 38 and 40 that forms the sockets described above. A cap 42 exerts a force on a load distributing member 44 that is atop the integrated circuit chip 10. The contact bumps are compressed against the socket metallization layer, causing some deformation of the compliant coating 36 that supports the socket metallization layer.

While the contact bumps 24 and 26 are shown in continuous contact with the socket metallization layer 38 and 40, typically continuous contact will not occur. As will be described and illustrated below with reference to FIG. 4, the sockets preferably have a slightly smaller dimension than the contact bumps, so that a firm wedging contact is established before travel of the integrated circuit chip 10 is limited either by the bottoming out of the contact bumps against the socket metallization layer or by contact of the encapsulant coating 20 of the chip against the compliant coating 36 of the substrate. The tightness of fit provided by the wedging achieves a number of desirable results. Firstly, the fit of the contact bumps into the sockets provides a degree of self alignment, since a slight misalignment of the integrated circuit chip relative to the substrate will be corrected as the bumps are pressed into the sockets.

A second desirable result of the wedging fit is that a broad contact is achieved to reduce current density significantly below a three-point contact that might result if the coating 36 did not allow some deformation of the sockets. Thirdly, the present invention permits a relaxation of the manufacturing tolerances with regard to planarity and accuracy of fit which would otherwise be required at the interface of the chip 10 with the substrate 12.

A fourth desirable result is a reduction in the susceptibility of the assembly to a momentary open circuit that could potentially result from differential motion between the integrated circuit chip 10 and the substrate 12.

The cap 42 may be a metal plate that is secured to the substrate 12 by fastening members, such as screws. However, the means for pressing the bumps 24 and 26 into the sockets of the socket metallization layer 38 and 40 is not critical. In a multi-chip module, the cap 42 may be pressed downwardly by a conventional heat spreader, or the cap may be the heat spreader itself.

The load distributing member 44 is an elastomeric member used to equalize the load across the integrated circuit chip 10. Optionally, the load distributing member 44 is a package seal that extends beyond what is shown in FIG. 2, so as to provide environmental protection. Environmental protection for the contact surfaces of the bump-and-socket arrangements may also be provided directly. For example, a coating of a soft material such as a silicone gel or a wax may be applied subsequent to mating of the bumps 24 and 26 to the socket metallization layer 38 and 40. Alternatively, before the mating of the bumps to the socket metallization layer, a contact-displaceable surface coating, such as polyphenyl ether, may be applied.

Figure 3:
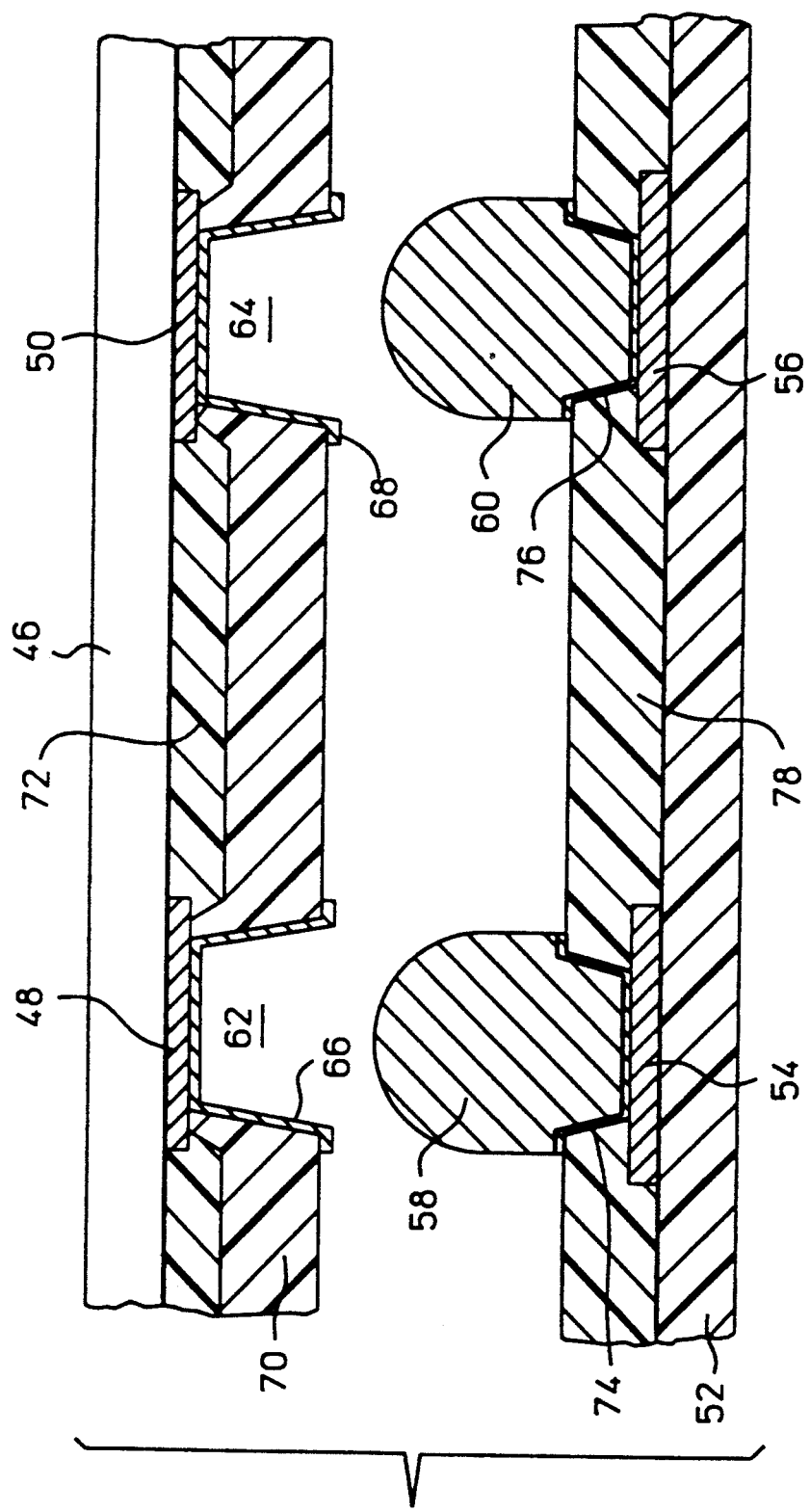
FIG. 3 is a side view of a second embodiment of a bump-and-socket arrangement in accordance with the present invention.

A second embodiment of the present invention is shown in FIG. 3. An integrated circuit chip 46 includes aluminum input/output pads 48 and 50 and a substrate 52 includes conductive traces 54 and 56 identical to the description above. In this second embodiment, the contact bumps 58 and 60 are raised from the substrate, while sockets 62 and 64 are fabricated at the surface of the chip 46 in alignment with the input/output pads. A socket metallization layer 66 and 68, such as chromium gold, is formed into depressed areas of a compliant layer 70, such as polyimide. In the same manner as described above, the compliant layer 70 allows some deformation of the socket metallization layer 66 and 68 upon insertion of the contact bumps 58 and 60 into the sockets. The compliant layer is formed on a passivation layer 72 using techniques known in the part.

At the substrate level 52, a base metallization layer 74 and 76 electrically joins the contact bumps 58 and 60 to the traces 54 and 56. A dielectric layer 78 is formed on the substrate 52 in areas between adjacent bumps.

Figure 4:
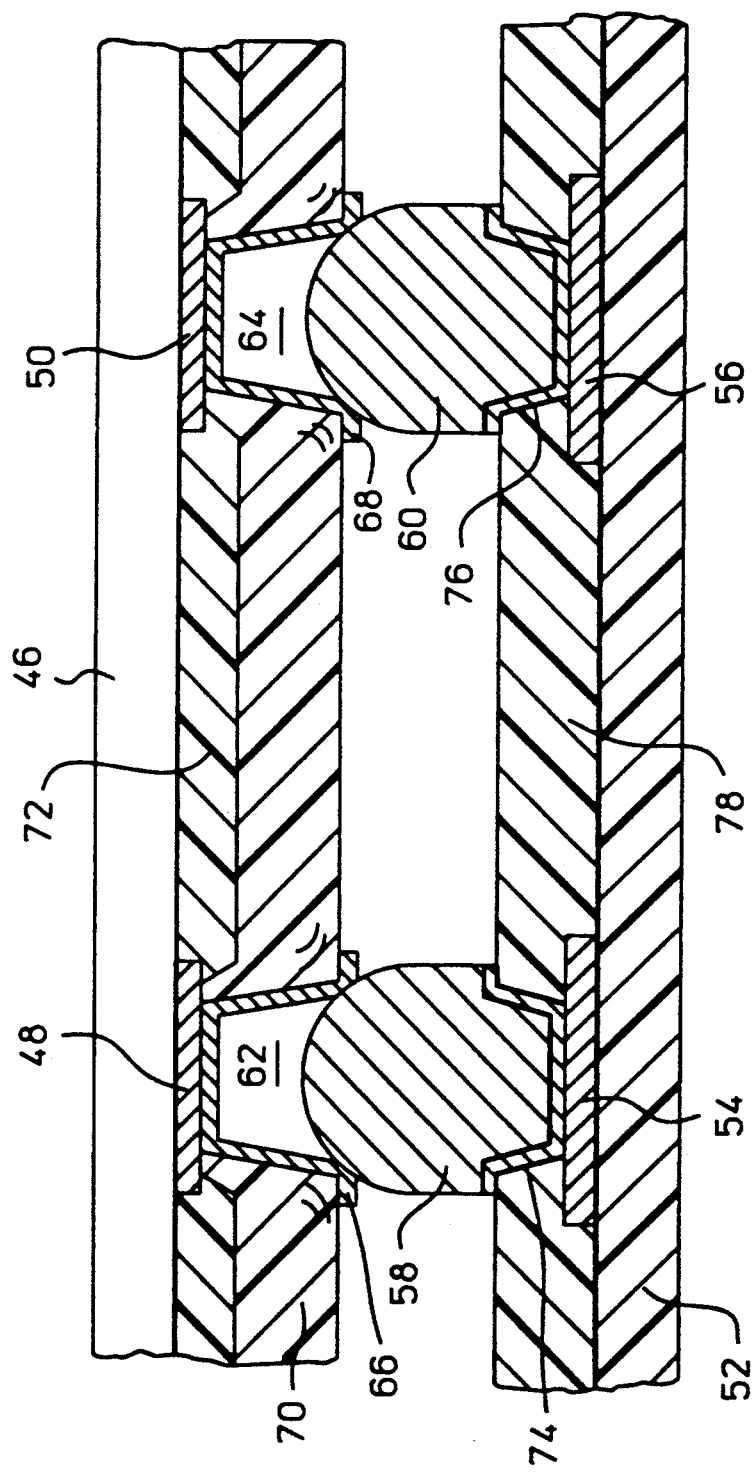
FIG. 4 is a side view of the chip and substrate of FIG. 3 following insertion of the bump of the substrate into the socket of the chip.

Referring now to FIG. 4, the firm wedging fit described above is achieved by compressing integrated circuit chip 46 utilizing a heat spreader or other cap mechanism, not shown. The contact bumps 58 and 60 press against the socket metallization layer 66 and 68 to form a ring of contact. The compliant layer 70 is deformed slightly, as is the socket metallization layer. However, as the integrated circuit chip is removed, the compliant layer returns to its original shape. Thus, the assembly of FIG. 4 is a demountable assembly that permits a defective chip to be removed from the substrate 52.

Figure 5:
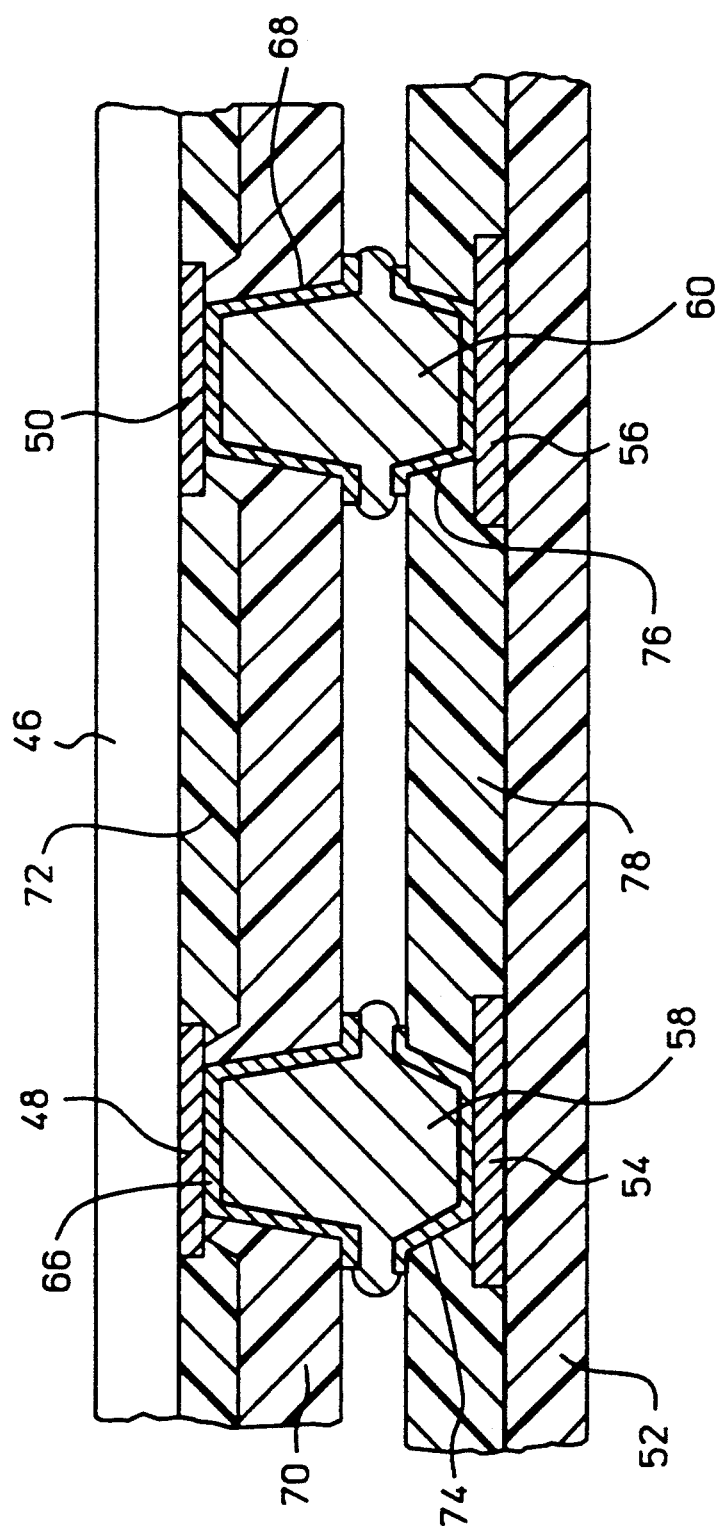
FIG. 5 is a side view of another embodiment of the assembly of FIG. 3.

FIG. 5 illustrates another embodiment of the present invention in which the contact bumps 58 are made of a material that is easily compressible to form a non-thermally induced connection by filling the entirety of the sockets formed by the socket metallization layer 66 and 68. While this embodiment does not provide all of the advantages of the assembly of FIG. 4, the bump-and-socket mechanism does achieve a degree of self alignment.

Figure 6:
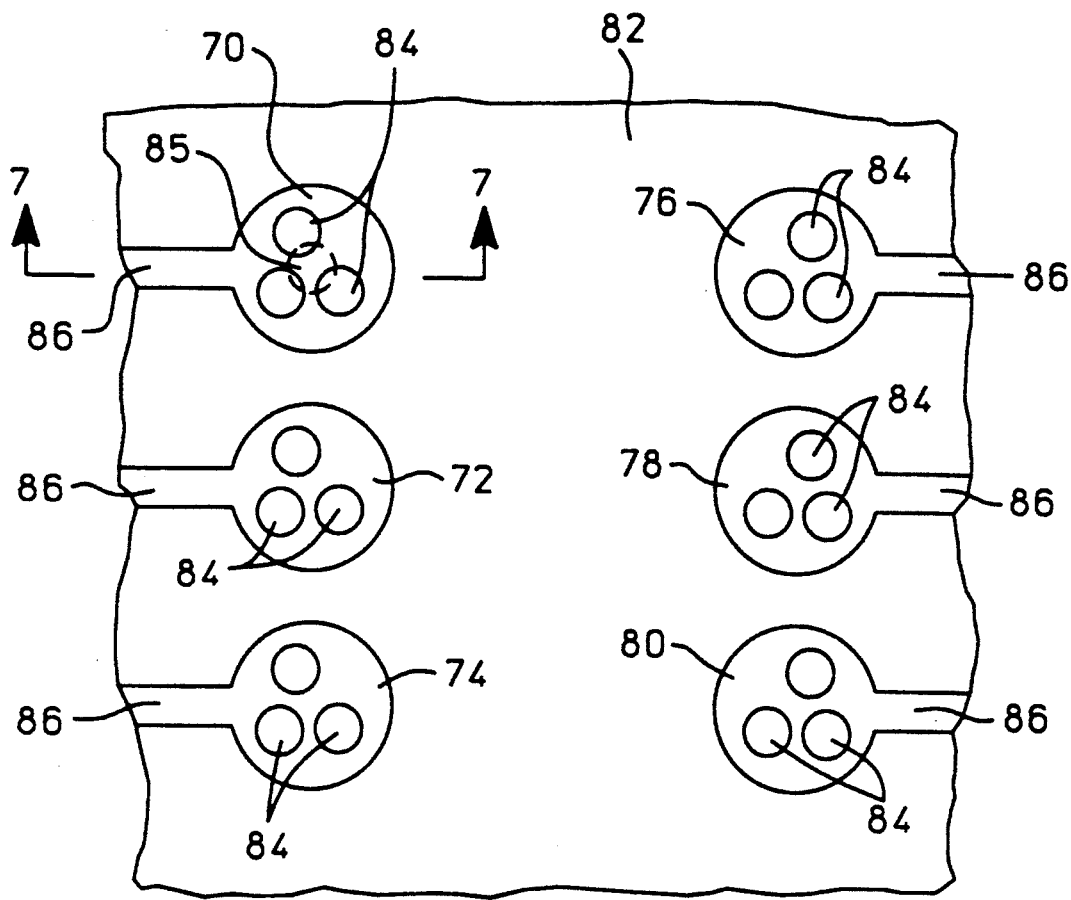
FIG. 6 is a top view of a substrate having sockets formed in accordance with another embodiment of the present invention.
Figure 7:
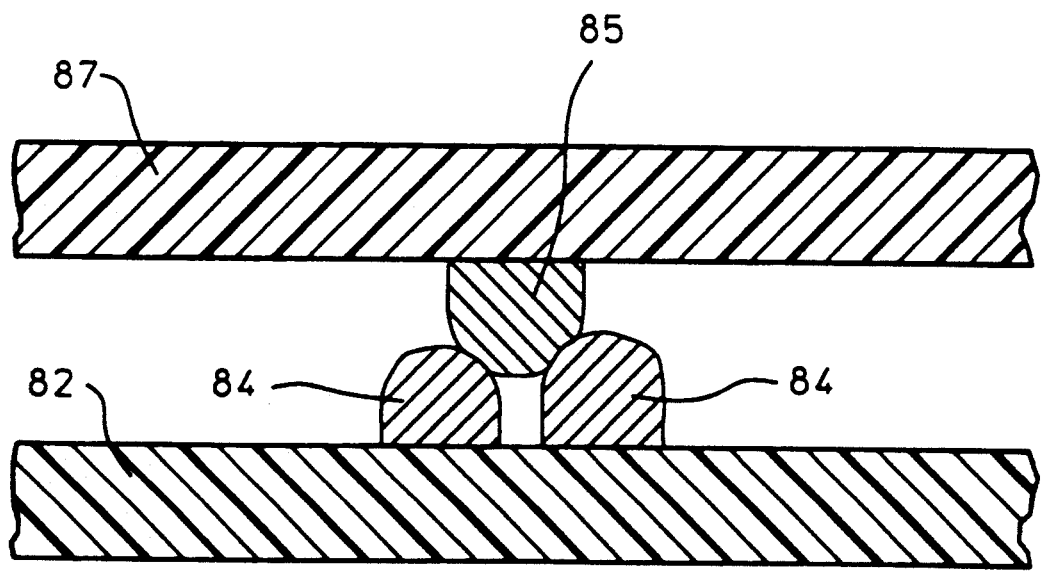
FIG. 7 is a side view of the embodiment of FIG. 6 taken along lines 7—7.

FIG. 6 is a top view of a substrate 82 having six sockets 70, 72, 74, 76, 78 and 80 that are each comprised of an array of three raised bumps 84. The bumps 84 of each array are configured to receive a single contact bump of a mating assembly component, thereby providing a reliable and demountable attachment of assembly components. A mated bump 85 is shown in phantom at the first socket 70 in FIG. 6 and is shown as extending downwardly from an integrated circuit chip 87 in FIG. 7. While the bumps 84 and 85 are shown as having a curved contour, they may have other configurations that provide the desired wedging action. For example, the bumps may have a frustoconical shape.

A conductive trace 86 provides a signal or a utility to each array for electrical communication between assembly components. Preferably, the array of bumps is on a compliant material, such as polyimide, so that an electrically and mechanically reliable connection is made. An advantage of a socket that is comprised of an array of bumps is that a single fabrication technique can be used to form both the bump and the socket. If desired, the arrays of bumps may have more than three bumps.

I claim:

1. An electrically and mechanically connected assembly comprising,
   a first member having opposed first and second surfaces, said first surface having a pattern of first contact areas disposed thereon and further having conductive bumps raised from said first contact areas,
   a second member having opposed third and fourth surfaces, said second member having connecting means for electrically connecting said second member to said first member, said connecting means including a pattern of depressed areas in said third surface, said pattern of depressed areas positionally corresponding to said conductive bumps of said first member, and
   compression means for exerting a force upon said second and fourth surfaces to press said conductive bumps into contact with said depressed areas, said contact between said bumps and said depressed areas being disengagable, said compression means thereby forming a non-thermally induced, disengaging bond for electrical communication of signals between said first and second members.

2. The assembly of claim 1 wherein one of said first and second members is an integrated circuit chip.

3. The assembly of claim 1 wherein said depressed areas of said second member are sockets formed in an elastic layer at said surface of said second member, said elastic layer being deformable to reconfigure said depressed areas in compliance with said conductive bumps.

4. The assembly of claim 1 wherein said conductive bumps are deformable in compliance with the configuration of said depressed areas upon said exertion of force by said compression means.

5. The assembly of claim 1 wherein said depressed areas have a depth less than the distance which said conductive bumps are raised from said first contact areas.

6. The assembly of claim 1 wherein said first member is an integrated circuit chip and said second member is a substrate having a layer of polyimide, said depressed areas being sockets formed in said polyimide, said polyimide having a coating of conductive material at said depressed areas.

7. The assembly of claim 1 wherein said second member is an integrated circuit chip and said first member is a chip package.

8. The assembly of claim 1 wherein said compression means includes a cap on said second surface of said first member, said cap coupled to said second member to press said first member onto said second member.

9. An electrically and mechanically interconnected assembly comprising,
 a substrate having a first pattern of contact sites on a first surface of said substrate,
 an integrated circuit chip having a second pattern of input/output pads on an active side of said integrated circuit chip, said second pattern being aligned with said first pattern,
 demountable means for electrically connecting said contact sites to said input/output pads, said demountable means including a bump-and-socket arrangement wherein a first one of said first and second patterns has electrically conductive raised bumps and wherein a second one of said first and second patterns has depressions to receive said raised bumps therein, said raised bumps being friction fit to said depressions, and
 depression means for maintaining said raised bumps within said depressions, said depression means for maintaining providing force to press said raised bumps into said depressions, said depression means for maintaining being disposed to apply said force to at least one of a surface opposite said first surface of said substrate and to a surface opposite to said active side of said integrated circuit chip, wherein said substrate and said integrated circuit chip are pressed together,
 said raised bumps having a geometry to limit the entry of said raised bumps into said depressions, said raised bumps thereby being spaced apart from the bottoms of said depressions.

10. The assembly of claim 9 wherein said depressions are formed in a compliant dielectric layer having a conductive film at said depressions.

11. The assembly of claim 10 wherein said compliant dielectric layer is polyimide.

12. The assembly of claim 9 wherein said substrate is a multi chip module having a plurality of integrated circuit chips connected by bump-and-socket arrangement.

13. An electrically and mechanically connected assembly comprising,
 an integrated circuit chip having a plurality of input/output pads disposed upon a surface thereof, said integrated circuit chip having a first external surface opposite to said surface containing said plurality of said input/output pads,
 a substrate having a plurality of contact sites, each contact site being aligned with an input/output pad, said substrate having a second external surface opposite to the surface containing said plurality of said contact sites.
 bump-and-socket arrangement electrically coupling said input/output pads to said contact sites, each bump-and-socket arrangement including a conductive raised bump received within a socket, and
 pressure means for maintaining said raised bumps within said sockets, said pressure means applying force on each of said first and second external surfaces, each bump-and-socket arrangement being deformed by said force, said raised bumps being removable form said sockets at a temperature below a melting point of said raised bumps upon removal of said pressure means.

14. The assembly of claim 13 wherein one of said raised bumps and said sockets are malleable, said one being deformed by the application of force by said pressure means.

15. The assembly of claim 14 wherein each socket is deformed by said application of force, each socket being a depressed area in a compliant layer on said substrate.

16. The assembly of claim 15 wherein said compliant layer has a layer of conductive material at each depressed area.

17. The assembly of claim 13 wherein said pressure means is a cap coupling said integrated circuit chip to said substrate.

* * * * *